United States Patent [19]

Pique et al.

[11] Patent Number: 5,635,453
[45] Date of Patent: Jun. 3, 1997

[54] SUPERCONDUCTING THIN FILM SYSTEM USING A GARNET SUBSTRATE

[75] Inventors: Alberto Pique, Bowie; Kolagani S. Harshavardhan, Greenbelt, both of Md.; Thirumalai Venkatesan, Washington, D.C.

[73] Assignee: Neocera, Inc., Beltsville, Md.

[21] Appl. No.: 362,894

[22] Filed: Dec. 23, 1994

[51] Int. Cl.$^6$ ........................................ B32B 9/00
[52] U.S. Cl. .................. 505/239; 505/237; 505/701; 428/930; 428/688; 428/701
[58] Field of Search ............................ 505/701, 702, 505/703, 704, 237, 239, 191; 252/62.3; 428/688, 689, 930, 701

[56] References Cited

U.S. PATENT DOCUMENTS

| | | | |
|---|---|---|---|
| 5,055,445 | 10/1991 | Belt | 505/729 |
| 5,057,484 | 10/1991 | Shiota | 428/688 |
| 5,077,270 | 12/1991 | Takeda | 428/688 |
| 5,159,413 | 10/1992 | Calviello | 505/191 |
| 5,229,360 | 7/1993 | Shiga | 505/701 |
| 5,302,559 | 4/1994 | Mateika | 252/62.3 |
| 5,418,215 | 5/1995 | Tauber | 428/688 |

OTHER PUBLICATIONS

Engineers Guide to High Tc Superconductors, Doss (1989) Wiley & Sons pp. 267–268.

*Primary Examiner*—Patrick Ryan
*Assistant Examiner*—Patrick Jewik
*Attorney, Agent, or Firm*—Morton J. Rosenberg; David I. Klein

[57] ABSTRACT

A superconducting thin film system (10) is provided for high frequency microwave applications where a single crystal high temperature superconducting layer (18) is integrated with a garnet substrate (12). A first perovskite compound buffer layer (14) is epitaxially grown on an upper surface of the garnet substrate layer (12) and defines a lattice constant less than the lattice constant of the garnet substrate layer (12). A second perovskite layer (16) is epitaxially grown on an upper surface of the first perovskite layer (14) and defines a lattice constant less than the lattice constant of the first perovskite layer. A high temperature superconducting layer (18) is epitaxially grown on an upper surface of the second perovskite layer (16) and is lattice matched to the second perovskite compound layer (16) for incorporation of passive components within the high temperature superconducting layer (18) having high frequency microwave applications.

9 Claims, 2 Drawing Sheets

5,635,453

SUPERCONDUCTING THIN FILM SYSTEM USING A GARNET SUBSTRATE

BACKGROUND OF THE INVENTION

1. Field of the Invention

The superconducting thin film system of the present invention relates to superconducting structures in combination with fabrication of such structures for general but not exclusive use in the high end micro-wave spectrum for particular application to satellite communications, cellular communications, radar and missile seeking devices which require higher frequencies in the millimeter wavelength region. Such structures are particularly useful for incorporation of passive microwave components incorporated within a high temperature superconducting layer (HTSC) with such components including resistors, capacitors, delay lines, filters, as well as a number of other electronic components. In particular, this invention pertains to superconducting thin film systems which provide for low microwave loss superconducting films integrated with garnet substrates. Still further, this invention relates to a superconducting thin film system where a single crystal high temperature superconducting layer (HTSC) is integrated with a garnet substrate through a plurality of epitaxially grown and contiguously interfacing transitional buffer layers where the buffer layers provide for a lattice constant matching criteria between a lattice constant of the garnet substrate and the lattice constant of the high temperature superconducting layer. Further, this invention directs itself to a superconducting thin film System which provides for a garnet substrate having a lattice constant with a first epitaxially grown and contiguously interfacing perovskite compound buffer layer being deposited on an upper surface of the garnet substrate with the perovskite compound buffer layer having a lattice constant less than the lattice constant of the garnet substrate. Additionally, the superconducting thin film system includes a second perovskite compound buffer layer epitaxially grown and contiguously interfacing with an upper surface of the first perovskite buffer layer with the second perovskite compound buffer layer having a lattice constant less than the lattice constant of the first perovskite buffer layer and matched to or approximating the lattice constant of a single crystal high temperature superconducting layer deposited on an upper surface of the second perovskite buffer layer. In order for superconducting films to be useful at higher frequencies, substrate dielectric losses must be reduced which requires a substrate such as garnet having a low dielectric constant, and low loss tangent. However, garnet substrates have a relatively large lattice constant and have been found to be generally incompatible for integration with high temperature superconducting layers. The subject superconducting thin film system provides a structure and method of forming the same which integrates the garnet substrate layer with the high temperature superconducting film through a series of perovskite compound buffer layers which have monatonically decreasing lattice constant and are epitaxially grown on the garnet substrate and each to the other to provide an overall structure having a decreasing lattice constant throughout the layered system with a final perovskite layer having a lattice constant substantially matching the lattice constant of the high temperature superconducting film.

2. Prior Art

High temperature superconducting thin films used in microwave components must be deposited on a microwave compatible substrate having a low dielectric constant and a low loss tangent to avoid unacceptable power dissipation in the substrate. High temperature superconducting thin films have been deposited on a variety of substrates including alkaline earth fluoride substrates with success. However, garnet substrates are of great importance and have found many uses in microwave applications due to their optimum magnetic properties. However, attempts to grow high quality, high temperature superconducting thin films on garnet substrates have generally proved unsuccessful due to the fact that the films which were produced were found generally to be polycrystalline and had relatively low superconductive transition temperatures, and poor microwave properties.

The main considerations dictating against the integration of high temperature superconducting films with garnet substrates are generally directed to (1) interfacial reactions between the garnet substrates and the high temperature superconducting films which are brought to the fore by the extremely high processing temperatures required for the growth of certain high temperature superconducting films; (2) a second consideration dictating against the integration of the high temperature superconducting films with a garnet substrate is due to the fact that there is a lack of lattice matching between the high temperature superconducting films which generally have a lattice constant approximating 3.8 Å to be grown on a garnet substrate having a lattice constant between 11.0–13.0 Å. This lattice mismatch dictates against the growth of highly oriented films, since a plurality of orientations are favored during the growth process, By use of buffer layers formed of perovskite compounds grown between the garnet substrate and the high temperature superconducting film, it has been found that a lattice matching technique and structure is formed which allows for highly oriented structures to be formed. By specifically growing perovskite compound layers having diminishing lattice constants between the garnet sublayer and the high temperature superconducting film, a highly oriented thin film superconducting layer is formed which is highly useful for microwave applications in the high frequency microwave spectrum range.

SUMMARY OF THE INVENTION

This invention provides for a superconducting thin film system having a single crystal high temperature superconductor layer integrated with a garnet substrate. The film system includes a garnet substrate having a predetermined garnet substrate lattice constant and a single crystal high temperature superconducting layer having a superconductivity layer lattice constant. A plurality of epitaxially grown and contiguous interfacing perovskite compound buffer layers are deposited between the garnet substrate and the high temperature superconducting layer. The perovskite compound layer grown or deposited on the garnet substrate has a lattice constant less than the garnet substrate lattice constant. A perovskite compound layer having the superconducting film layer grown thereon has a lattice constant substantially matching the (HTSC) superconductivity layer lattice constant.

DESCRIPTION OF THE PREFERRED EMBODIMENTS

Figure 1:
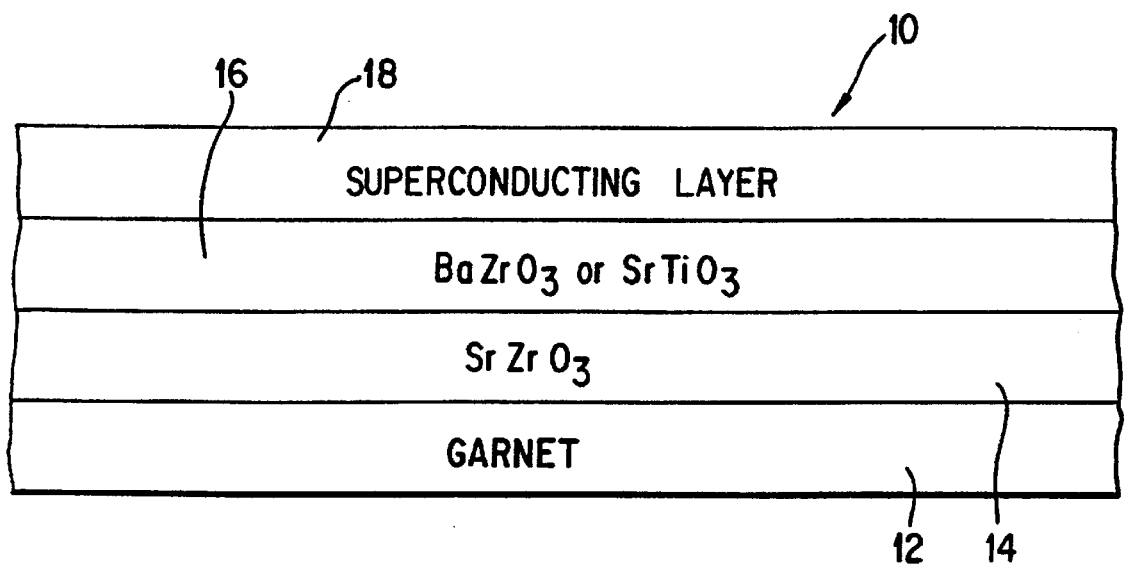
FIG. 1 is a schematic view of the superconducting thin film layer system showing a garnet substrate and a superconducting thin film layer integrated therewith by epitaxially grown perovskite compound layers.
Figure 2:
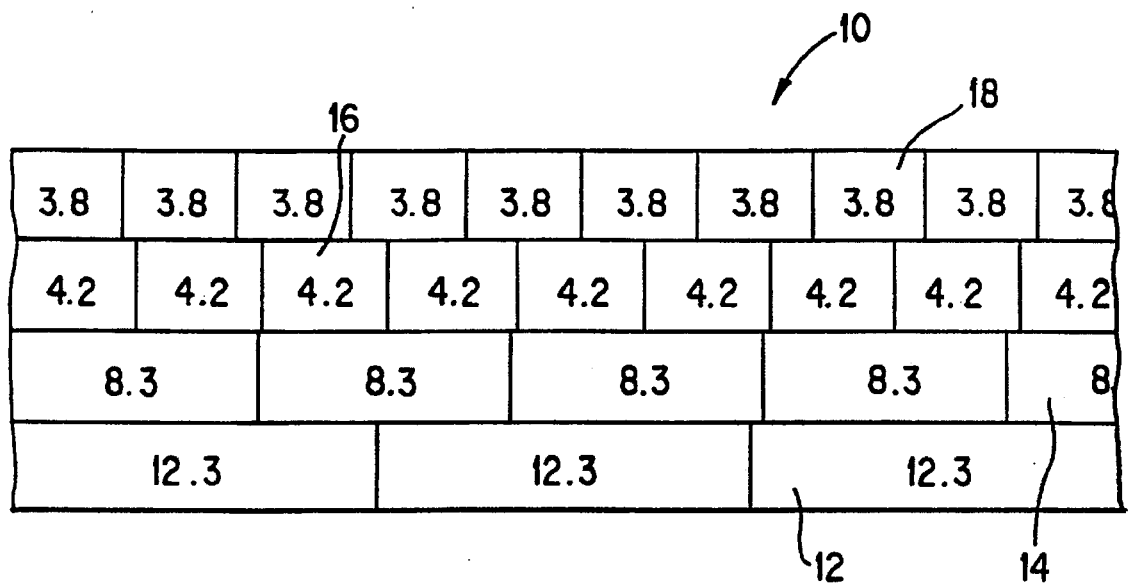
FIG. 2 is a schematic diagram of the superconducting thin film system showing exemplary layer lattice constants of respective layers of the overall thin film system; and, FIG. 3 is a perspective diagram of the superconducting thin film system showing oriented layers.
Figure 3:
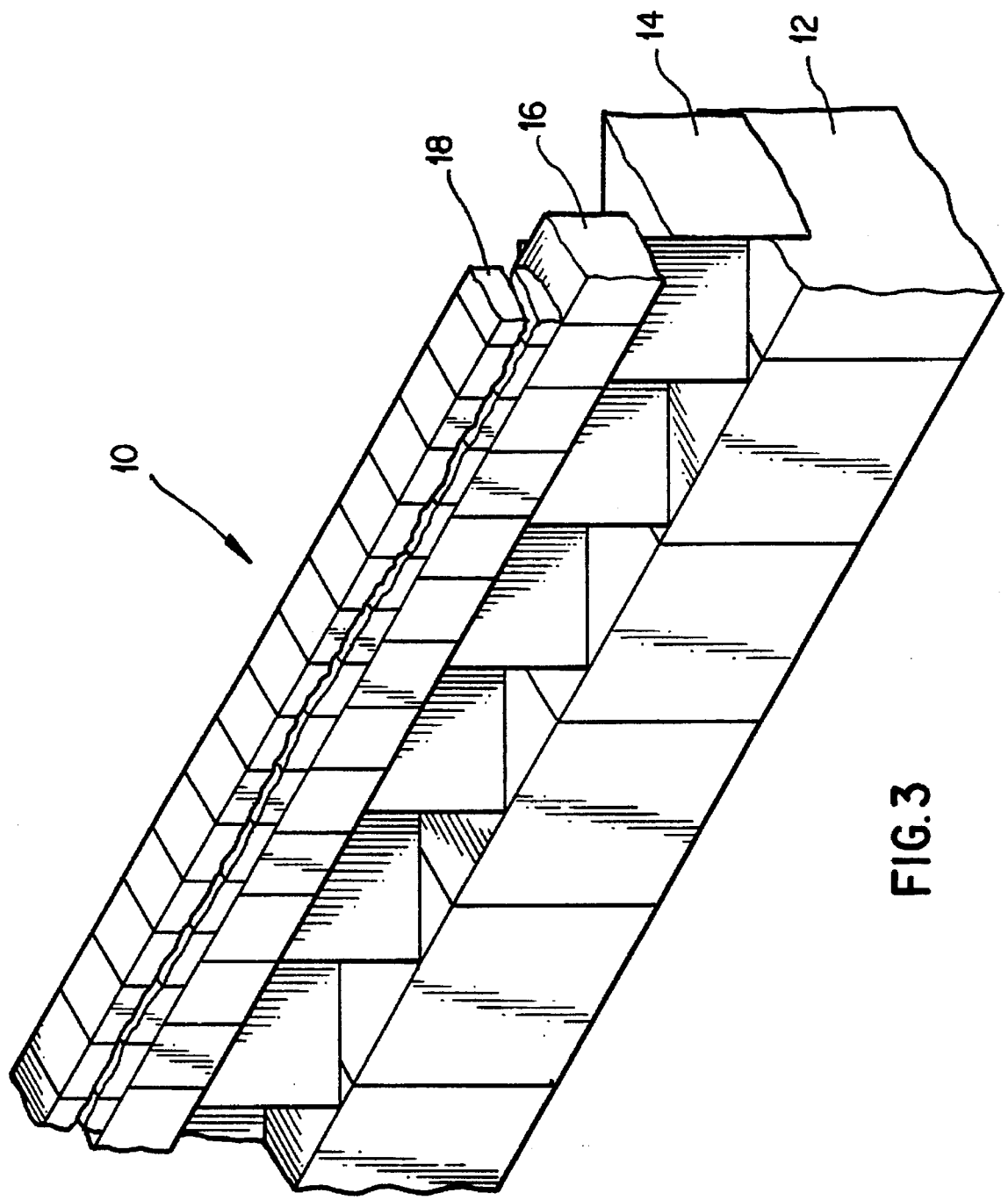

Referring now to FIGS. 1–3, there is shown superconducting thin film system 10 for integration of high temperature superconducting layer (HTSC) 18 with garnet substrate 12 for particular use in microwave applications where electronic devices may be fabricated by the incorporation of components such as low loss passive networks, filters and other like devices into HTSC 18. In the fabrication of microwave components, HTSC thin films are extremely useful; however, such must be deposited on substrates which are microwave compatible generally having a low dielectric constant as well as a low loss tangent in order to avoid unacceptable power dissipation in the substrate.

The HTSC layer 18 as referred to with respect to the inventive concept herein described includes compounds within the families of YBaCuO (YBCO), TBaCaCuO and BiSrCaCuO, as well as analogues thereof.

Garnet substrates 12 have been found to have acceptable microwave properties and generally low dielectric constants with an acceptable low loss tangent. However, in general, garnet substrates 12 have not been able to be used with HTSC layers 18 for a variety of reasons including a mismatch in the lattice constant between garnet substrates 12 (generally between 11–13 Å) and HTSC layer 18 (typically approximating 4.0 Å) which causes undesirable orientations between the substrate and the film, which results in the formation of grain boundaries which cause a reduction in current density and poor microwave performance, and disadvantageous interfacial reactions between the HTSC layer 18 and the garnet layer 12 are created by a number of parameters including the high processing temperatures required for the growth of HTSC layer systems.

The object of this invention is to develop a superconducting thin film system and fabrication technique for providing microwave compatible HTSC layers 18 integrated with garnet substrates 12 resulting in a unique building block for advanced microwave systems.

Garnet layer 12 is a mineral silicate class of compounds which are isometric in crystallization having a general chemical formulation $A_3B_5O_{12}$. Such particular garnet compounds where A is a rare earth element such as yttrium or gadolinium and B being either iron or gallium have been found to be particularly useful in providing the high quality microwave compatible HTSC layers 18 as herein described. Of particular importance are the yttrium gadolinium garnet (YIG) and the gadolinium gallium garnet (GGG) having a cubic crystalline structure with acceptable microwave application parameters. Prior attempts to grow HTSC layers 18 on YIG or GGG layers 12 generally produced films that were not monocrystalline but rather polycrystalline having low superconductive transition temperatures which did not produce acceptable microwave application systems. Yttrium iron garnets have excellent magnetic properties for microwave applications and with the ability to grow an HTSC layer 18 on the YIG layer 12 would allow for fabrication of efficient microwave non-reciprocal devices minimizing the overall system space requirements which is of particular interest to the communications industry for on-board mounting on satellites or other space vehicles, and cellular communication stations.

HTSC layer 18 may be formed of yttrium barium copper oxide (YBCO) for use in trying to integrate such with garnet substrate layer 12. However, YBCO layer 18 and garnet layer 12 have a large lattice constant mismatch. The cubic unit cell of the garnet layer 12 has lattice constants approximately ranging between 11.0 Å–13.0 Å and as compared to the YBCO layer 18$a$–$b$ plane which has dimensions of a=3.82 Å and b=3.89 Å. Obviously, more than one orientation would be favored by this mismatch and microwave quality YBCO films 18 with one unique orientation cannot be grown on garnet substrates 12 under these conditions.

In accordance with the inventive concept as herein described, it was hypothesized that a plurality of epitaxially grown layers having gradually decreasing lattice constants and sandwiched between HTSC layer 18 and garnet substrate 12 could significantly reduce the lattice constant mismatch.

Thus, in order to attain a lattice constant transition between layer 12 and HTSC layer 18, it has now been found that a class of compounds called perovskite compounds provide for a transitional lattice constant between layers 12 and 18 which allows for highly oriented single crystalline YBCO films 18 to be grown on garnet substrates 12.

Perovskite compounds are minerals having a crystal structure which is ideally cubic and may occur as rounded cubes modified by octahedral and dodecahedral forms. The cubic nature of the perovskite compounds is useful in the epitaxial growth of such layers on garnet layer 12 as well as growth or deposition on each other.

Of particular importance, it has been found that certain perovskite compounds may be ideally used as transitional layers between substrate 12 and HTSC layer 18 to provide diminishing and non-obstructive lattice constant transitional values between garnet layer 12 and HTSC layer 18.

It has been found that the perovskite compound $SrZrO_3$ (SZO) has an orthorhombic structure. The $SrZrO_3$ has lattice parameters approximating a=5.792 Å, b=5.818 Å, and c=8.189 Å. Layer 14 formed of the $SrZrO_3$ (SZO) has unit cells which when aligned in the [110] direction of the yttrium iron garnet (YIG) [100] plane provided for a mismatch of the unit cells approximating 0.5%.

SZO films were grown on both GGG and YIG substrates 12 in thickness ranges between 1000–2000 Å. The films were epitaxially grown on substrate 12 and the film epitaxy was confirmed by both X-ray diffraction and ion beam channeling analysis. X-ray phi-scans reveal that the SZO (100) plane had grown in parallel manner to the YIG and GGG layer 12 (100) planes however, such was rotated by an angle of 45° along the normal.

The SZO layer 14 was deposited by pulsed laser deposition techniques at $O_2$ partial pressure of approximately 200 Torr and a temperature of approximately 850° C. and YBCO film 18 was deposited on both the SZO-GGG and the SZO-YIG layers 12. The HTSC film 18 was deposited with a thickness approximating 3000 Å and was deposited at an oxygen partial pressure of 220 mTorr and a temperature approximating 750° C. The combined resulting films 18 provided superconductive transition temperatures above 87K however there was found to be an approximate mismatch of 7.3% between the YBCO film 18 and the SZO film 14.

Although a reasonable quality microwave application system was found using an SZO layer 14 sandwiched between garnet layer 12 and YBCO layer 18, in order to further reduce any mismatch between the perovskite layer 14 and the YBCO layer 18, a further perovskite layer 16 investigation was initiated to still further lower any mismatch between the perovskite compound layer and the HTSC layer 18.

The second buffer layer 16 investigation was based upon a search for a perovskite compound with lattice parameters between the SZO layer 14 and the YBCO layer 18. The basic criteria was to find a perovskite layer 16 which could be grown epitaxially on first perovskite layer 14 and reduce the lattice constant mismatch between the second layer 16 and the YBCO layer 18.

Lattice constants on the a, b plane between the approximate 5.8 lattice constant of layer 14 and the HTSC layer lattice constant 3.8 were made prime candidates for the second buffering layer 16. $SrTiO_3$ (STO) having a lattice constant of approximately 3.9 Å and $BaZrO_3$ (BZO) having a lattice constant approximating 4.2 Å were selected to determine whether such were amenable to the epitaxial growth and fabrication of system.

In both the cases of STO and BZO, the (001) plane was rotated by 45° along the normal to fit on the SZO 14 plane. The mismatch between the STO and SZO layers 12 and 14 approximated 4.8%. The mismatch between the BZO layer and SZO layer 14 approximated 3.1%. Films of the compounds STO and BZO were deposited to a thickness of 500 Å and were deposited at 750° C. with a partial oxygen pressure of 220 mTorr. Film epitaxy for both STO and BZO and plane rotation was confirmed through X-ray phi-scans. YBCO films 18 were deposited on both the STO and BZO layers 16 and provided transition temperatures greater than 88K with transition widths being less than 0.5K. The superconductive film properties using the second layers of STO and BZO 16 was more pronounced for films grown on YIG substrates 12 than GGG substrates 12 due to an improved diffusion barrier resulting from the two buffer combination.

In overall concept, it has now been found that a superconducting thin film system 10, particularly useful in microwave applications, may be formed by integrating superconducting layer 18 with garnet substrate 12 through means of a plurality of buffering layers such as layers 14 and 16. The buffering layers 14 and 16 must be epitaxially grown to substrate 12, to each other, and to superconducting layer 18. A particular class of compounds called perovskite compounds have been found useful in fabricating system 10 since such are approximately cubic in nature and can be interfaced with substrate 12 and layer 18 in an epitaxial relationship. Additionally, particular perovskite compounds have been chosen to allow for a transitional diminishment of the lattice constant between the garnet substrate 12 and the superconducting layer 18. In this manner, the superconducting layer 18 may be epitaxially grown on a top buffering layer 16 with a minimal lattice constant mismatch resulting in highly oriented films being grown.

In the method of forming superconducting thin film system 10 garnet substrate 12 is initially established which has a garnet substrate lattice constant generally between 11 Å and 13 Å. In one form of the invention concept, a perovskite compound buffer layer 14 is epitaxially grown on a garnet substrate with the perovskite compound buffer layer 14 having a lattice constant less than the garnet substrate lattice constant. A high temperature superconducting layer 18 is epitaxially deposited on the perovskite compound buffer layer 14 with the high temperature superconducting layer 18 having a lattice constant less than the lattice constant of the perovskite compound buffer layer 14. In this manner, there is a transition between the relatively high lattice constant of the substrate 12 and the relatively low lattice constant of the superconducting layer 18.

The perovskite compound layer 14 is pulse laser deposited on an upper surface of the garnet substrate in an environment approximating a temperature of 750° C. with an oxygen partial pressure approximating 220 mTorr. The established garnet substrate layer 12 may be selected from the group consisting of YIG, GGG or YAG. Additionally, the perovskite layer 14 compound may be formed of $SrZrO_3$. Use of this perovskite compound results in a transitional layer having a lattice constant approximating 5.8 which is a lattice constant nested between the lattice constant of layers 12 and 18.

In order to further diminish any mismatch between superconducting layer 18 and a last buffering layer of a perovskite compound, additional transitional buffering layers may be incorporated into the fabrication of system 10. Initially, garnet substrate 12 is established and a first perovskite compound buffer layer 14 is epitaxially grown on an upper surface of garnet substrate 12. First perovskite compound buffer layer 14 has a lattice constant less than the garnet substrate lattice constant to provide a first transitional buffering layer. A second perovskite compound buffer layer 16 is sequentially and epitaxially grown on an upper surface of first perovskite compound layer 14 with the second perovskite compound buffer layer 16 having a lattice constant less than the first perovskite compound buffer layer lattice constant. Finally, high temperature superconducting layer 18 is epitaxially deposited or grown on second perovskite compound layer 16 with the high temperature superconducting layer 18 having a lattice constant approximating the lattice constant of the second perovskite compound layer lattice constant. In this manner there is a more gradual decrease or transition from one layer to another layer within overall system 10 and a mismatch of the lattice constant between upper perovskite compound layer 16 and HTSC layer 18 may be further minimized.

The first perovskite compound layer 14 may be pulse laser deposited on substrate 12 and second perovskite compound layer 16 similarly may be pulse laser deposited on first perovskite compound layer 14. Finally, HTSC layer 18 may similarly be pulse laser deposited on an upper surface of second perovskite compound layer 16.

Additionally, in order to provide the transitional lattice constants, first perovskite compound layer 14 may be formed of $SrZrO_3$ with second perovskite compound layer 16 being selected from the group consisting of $BaZrO_3$ and $SrTiO_3$.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A superconducting thin film system having a single crystal high temperature superconducting layer integrated with a garnet substrate comprising:
   a garnet substrate having a predetermined garnet substrate lattice constant;
   a single crystal high temperature superconducting layer having a predetermined high temperature superconductivity layer lattice constant; and,
   a plurality of epitaxially grown and contiguously interfacing perovskite compound buffer layers deposited between said garnet substrate and said high temperature superconducting layer, a first of said perovskite compound layers having a lattice constant less than said predetermined garnet substrate lattice constant and grown in substantially parallel relation to said garnet substrate, a last of said perovskite compound layers having a lattice constant substantially matching said superconductivity layer lattice constant, one of said perovskite layers being formed of a compound having a formula $AZrO_3$ of substantially cubic or orthorhombic crystalline structure where A is an element from the group consisting of barium or strontium.

2. The superconducting thin film system as recited in claim 1 including at least one intermediate perovskite compound layer epitaxially grown on a next preceding perovskite layer having a predetermined intermediate perovskite compound layer lattice constant nested between a next succeeding and a next preceding perovskite compound layer lattice constant.

3. The superconducting thin film system as recited in claim 1 where said high temperature superconducting layer is selected from the group consisting of YBaCuO (YBCO), BiSrCaCuO and TBaCaCuO.

4. The superconducting thin film system as recited in claim 3 where said YBCO superconducting layer has a lattice constant approximating 3.8 Å.

5. The superconducting thin film system as recited in claim 1 where said garnet substrate is a garnet compound having the formula $A_3B_5O_{12}$, where:

A=a rare earth element

B=iron, gallium, or aluminum

O=oxygen.

6. The superconducting thin film system as recited in claim 5 where said rare earth element is an element from the group consisting of yttrium or gadolinium.

7. The superconducting thin film system as recited in claim 6 where said garnet compound has a lattice constant within the approximating range between 11 and 13 Å.

8. The superconducting thin film system as recited in claim 1 where said first of said perovskite layers is formed of $SrZrO_3$ having a lattice constant approximating a dimension defined by a=5.814 Å, b=5.799 Å and c=8.196 Å.

9. The superconducting thin film system as recited in claim 1 where said last of said perovskite layers is formed of $BaZrO_3$ having a lattice constant approximating 4.2 Å.

* * * * *